(12) United States Patent
Rolf

(10) Patent No.: US 9,398,718 B2
(45) Date of Patent: Jul. 19, 2016

(54) VSAT MODEM SHELF

(75) Inventor: Donald E. Rolf, Allen, TX (US)

(73) Assignee: VERIZON PATENT AND LICENSING INC., Basking Ridge, NJ (US)

( * ) Notice: Subject to any disclaimer, the term of this patent is extended or adjusted under 35 U.S.C. 154(b) by 1610 days.

(21) Appl. No.: 12/777,566

(22) Filed: May 11, 2010

(65) Prior Publication Data

US 2011/0280292 A1 Nov. 17, 2011

(51) Int. Cl.
*H04L 5/16* (2006.01)
*H05K 13/00* (2006.01)
*H05K 7/14* (2006.01)
*H04L 12/64* (2006.01)

(52) U.S. Cl.
CPC ............... *H05K 7/1491* (2013.01); *H04L 5/16* (2013.01); *H04L 2012/6421* (2013.01); *Y10T 29/49002* (2015.01)

(58) Field of Classification Search
CPC H04L 5/16; H04L 2012/6421; H05K 7/1491; Y10T 29/49002
See application file for complete search history.

(56) References Cited

U.S. PATENT DOCUMENTS

| | | | | |
|---|---|---|---|---|
| 5,786,770 A | * | 7/1998 | Thompson | 709/230 |
| 6,206,480 B1 | * | 3/2001 | Thompson | 361/625 |
| 2003/0004925 A1 | * | 1/2003 | Knoblock et al. | 707/1 |
| 2008/0080827 A1 | * | 4/2008 | Leon et al. | 385/135 |

* cited by examiner

*Primary Examiner* — Lonnie Sweet

(57) ABSTRACT

A modem configuration system having at least one modem configured to receive a configuration signal; and at least one media at least one media support surface positioned in a media rack, wherein the modem is selectively positioned on and connected to at least one auto-configuration server through at least one media line fixed to the media support surface and operable to provide a signal.

22 Claims, 10 Drawing Sheets

VSAT MODEM SHELF

BACKGROUND

Communication networks require a wide variety of auxiliary equipment to transmit and receive data. These networks may utilize a commercial satellite connection as a high speed link between customers and providers. Typically, main components of this type of communication network may include a communications satellite dish, an indoor modem, a control station and a network operations center. Generally, the communication network ground-based electronics require that the indoor modem be programmed upon implementation to facilitate data transfer across the network using a communications satellite as a relay. This allows the end user computer, connected to the network, to be able to open and use a web address by requesting and receiving data across the network.

The process of requesting and receiving data is conducted through the modem and ultimately through the network. The modem is programmed to modulate a specific signal and then pass that signal to the network and finally through the communications satellite dish. The satellite dish converts this signal to an RF signal and transmits the signal to a satellite, which receives and sends the signal to a control station. Thus, a multitude of modems are required to send and receive this signal and data across the network. Generally, the modems are individually programmed by a technician prior to being sent in the field at each user location. Typically, the technician manually logs into a database for configuration information; then the users manually configure the data information into a system platform. Once the configuration is in the system platform, the technician copies the configuration to a portable storage device. After transferring the configuration to a portable storage device, the technician will manually log into a provisioning station and manually configure each modem individually. This process is exceptionally time consuming and creates multiple points of variation that can cause an incomplete or corrupt configuration.

Accordingly, there is a need in the art for a stream-lined approach for programming a network modem, which can generally reduce time and reduce variation in the programming process.

DETAILED DESCRIPTION

Figure 1:
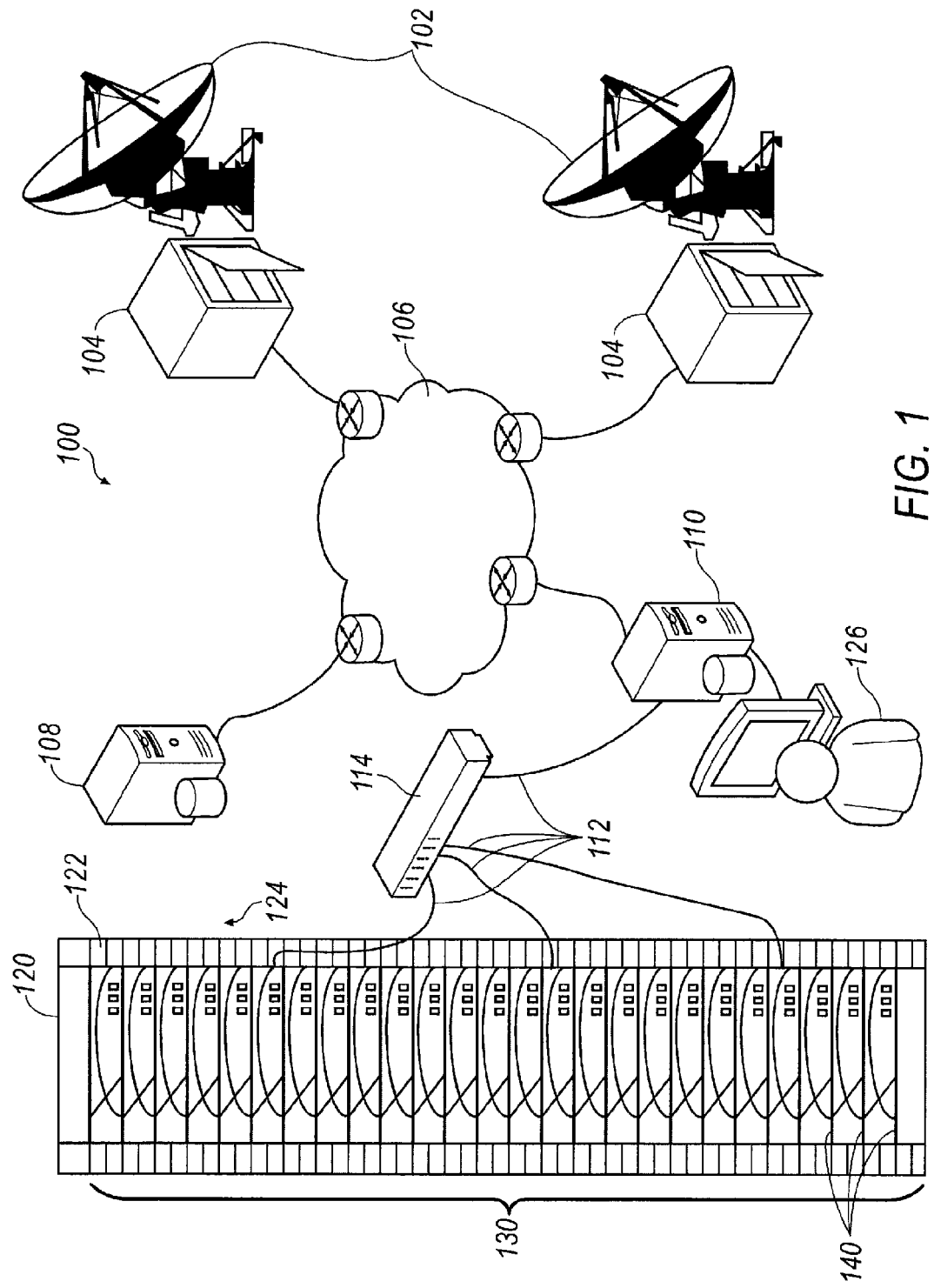
FIG. 1 illustrates an exemplary communication network.

Referring now to the discussion that follows and also to the drawings, illustrative approaches to the disclosed apparatuses and methods are shown in detail. Although the drawings represent some possible approaches, the drawings are not necessarily to scale and certain features may be exaggerated, removed, or partially sectioned to better illustrate and explain the disclosed device. Further, the descriptions set forth herein are not intended to be exhaustive or otherwise limit or restrict the claims to the precise forms and configurations shown in the drawings and disclosed in the following detailed description.

Various examples of a media configuration assembly that is interconnected to a data network are disclosed. The media configuration assembly may include a media support shelf system and method of programming a VSAT (very small aperture terminal) modem utilizing the support shelf are disclosed. Any VSAT compatible modem may be used, such as, but not limited to an iDirect™ modem or a LinkStar™ modem. While the exemplary system and method are described herein generally in the context of communication networks, various communication-based network modem support shelves may be employed as an alternative or in addition to the modem and support shelf in an exemplary rack or method of connecting and programming the exemplary modem with a configuration server.

An exemplary communication network may generally include at least one satellite earth station selectively connected to a satellite communications hub that transmits a signal to a satellite and at least one other satellite earth station selectively connected to a satellite communications hub that receives the signal from the satellite. The communication hubs may be connected to a data network having a plurality of sub-connections. The sub-connections may lead to a database server, a configuration server and other users on the network. In order for the users to decode the signal, a modem must be configured to a VSAT communication hub computer program.

An exemplary media rack supporting shelf system may generally include a media rack configured to selectively receive a plurality of modem support shelves and selectively contain a series of media lines and power cables. The system shelf may include an alignment mechanism, which may include a plurality of media supports and at least one alignment guide that may provide a self locating feature to a modem that is inserted into the rack and onto the support shelf. The modem includes communication ports that may be selectively connected to a plurality of media lines and a power supply cable for data communication/programming. After programming, the modem ports may be verified for proper communication, and the modem may be selectively removed by sliding it off the support shelf and away from the media lines.

An exemplary method may include organizing a media rack and a modem support shelf with a desired wiring configuration based on a desired modem, inserting a multitude of the desired modems into multiple modem racks by sliding the modems along alignment rails to engage the wiring configuration with the modems' communication ports, setting up an auto-configuration server by downloading a system program from the communication hubs' configuration, verifying the modems' communication ports are working properly and then uploading that configuration to multiple modems at least generally simultaneously. The method may further include verifying that the programming was uploaded successfully.

Figure 2:
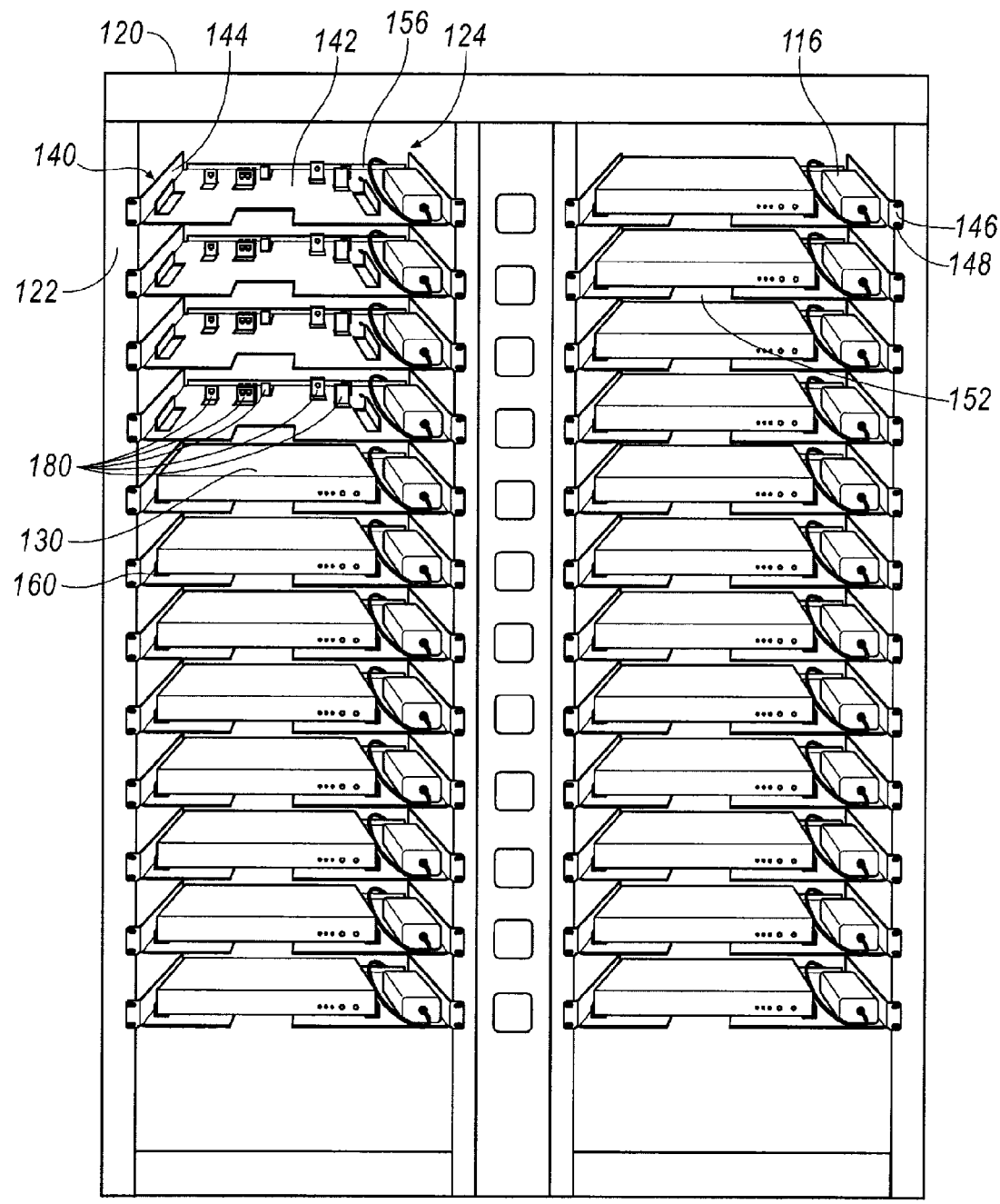
FIG. 2 illustrates an exemplary communications rack with multiple modems positioned on modem shelves.

Turning now to FIGS. 1 and 2, an exemplary communication network 100 is illustrated. The communication network 100 may generally include at least one communication satellite 102 that may transmit and receive a media signal (not shown) to a communications hub 104. The hub 104 may relay the signal to at least one data network 106 and through at least one satellite modem 130, which may communicate the signal to at least one database server 108 and to at least one auto-configuration server 110. The data network 106 may also enable communication between the database server 108 and the auto-configuration server 110.

The satellite modems 130 are required to be configured with the satellite 102 parameters from the hub 104 prior to being installed within the network 100. This process can be considered time consuming due to the powering up sequence and connection or disconnection of the media lines 112. Programming may be conducted utilizing the auto-configuration server 110 that is directly connected to the network 100. As illustrated in FIG. 1, the auto-configuration server 110 may be physically connected through at least one media line 112 to an Ethernet switch 114, which may be connected to at least one modem 130. The media line 112 may be a fiber optic cable, a coaxial cable and a local area network (LAN) cable. The Ethernet switch 114 enables at least one auto-configuration server 110 to communicate with a multitude of modems 130. The modems 130 may be positioned in any configuration during programming, but typically the modems 130 may be stacked on media support shelves 140 within at least one media rack 120. As shown in FIG. 2 the media support shelf 140 may be attached to the front face 122 of the media rack 120. However, in some circumstances, a media support shelf 140 may be attached to a sliding mechanism to slide the shelf in and out of the media rack 120. The number of modems 130 that can be programmed at one time depends at least in part on the media rack 120 size and the number of ports on the Ethernet switch 114, as well as the capabilities of auto-configuration server 110.

Figure 3:
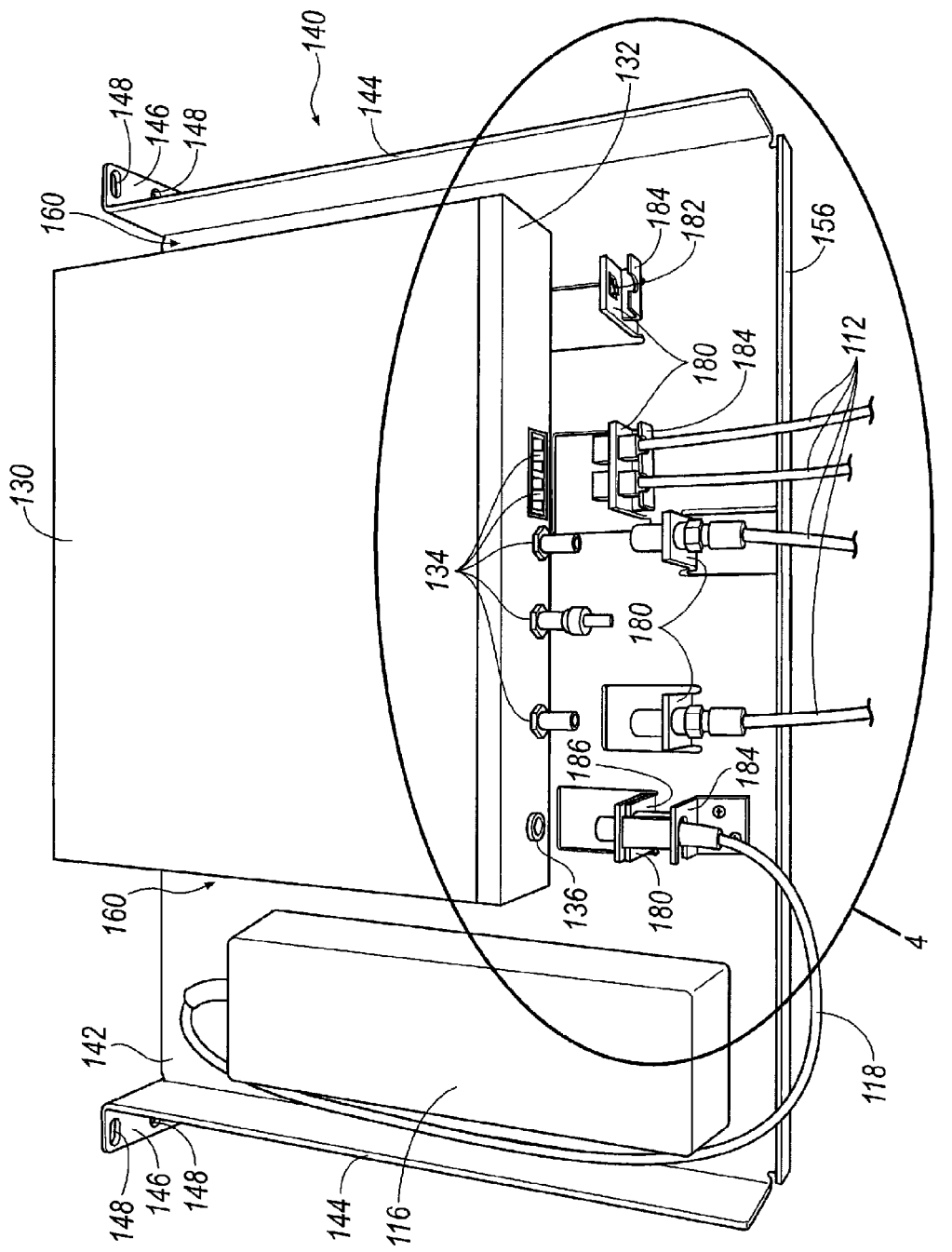
FIG. 3 illustrates a modem shelf with power supply and network communication lines installed on the modem shelf.
Figure 4:
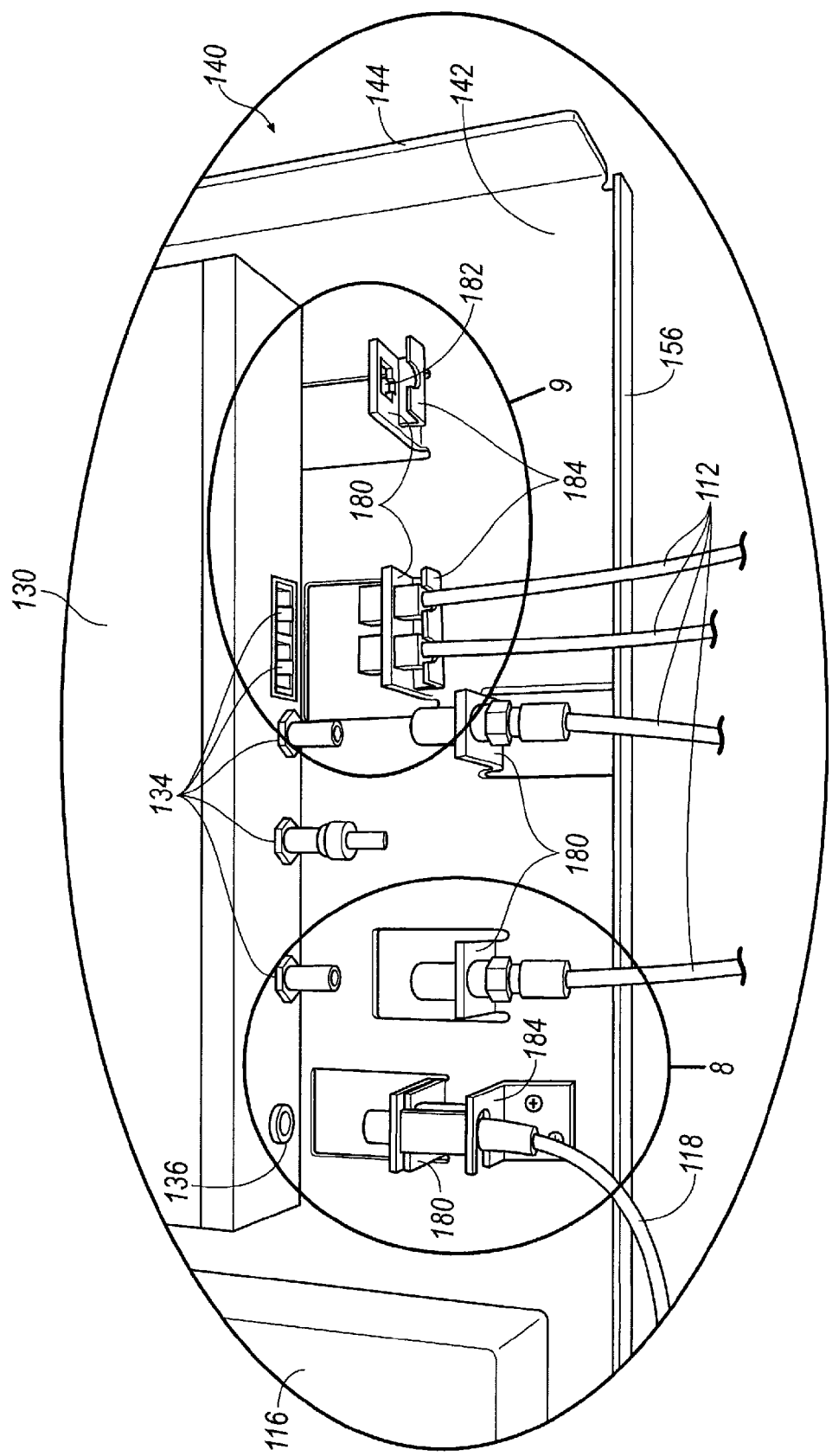
FIG. 4 illustrates a close up view of an exemplary modem having a first wiring configuration prior to engagement with a communication network.
Figure 5:
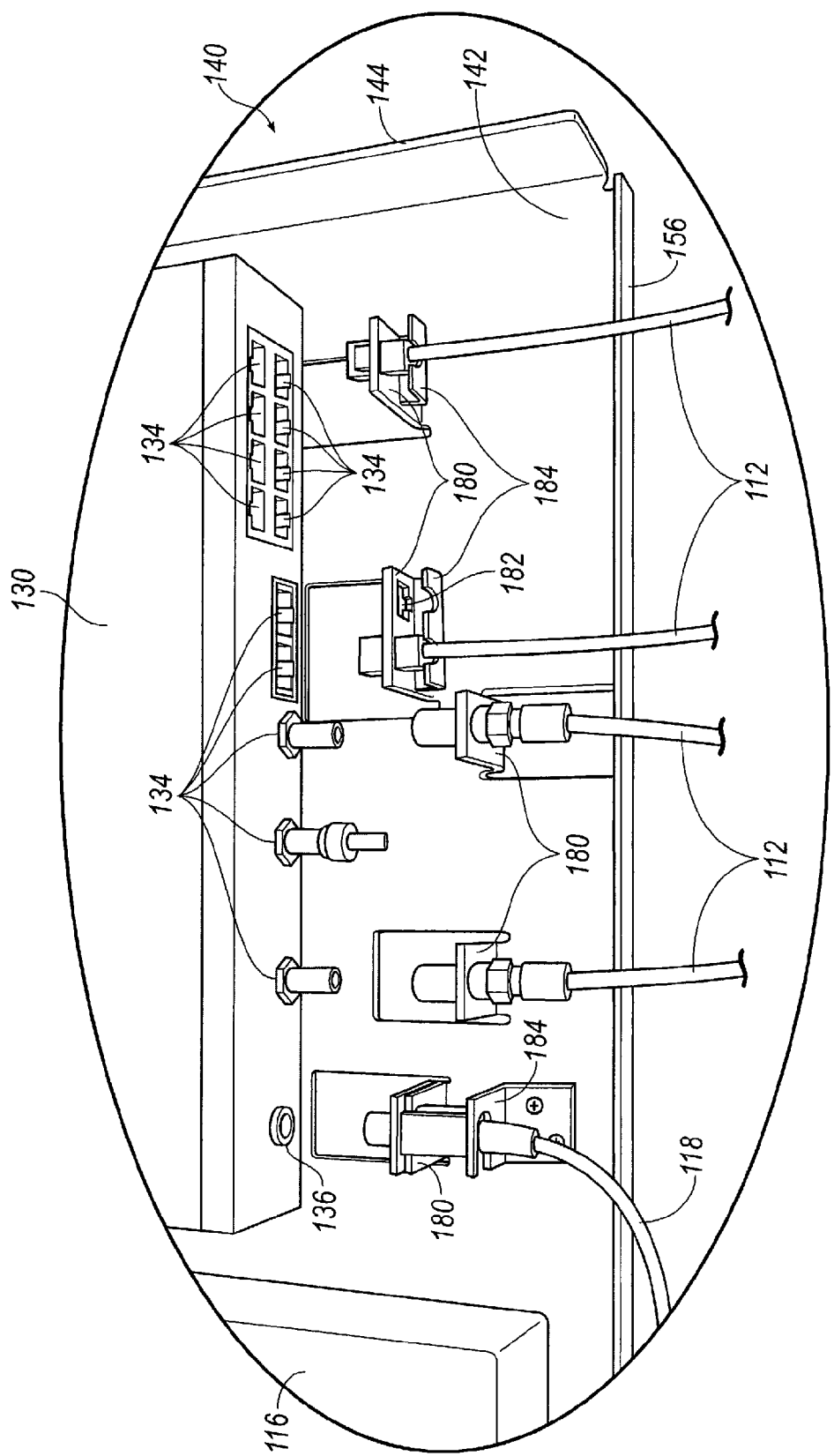
FIG. 5 illustrates a close up view of an exemplary modem having a second wiring configuration prior to engagement with a communication network.
Figure 6:
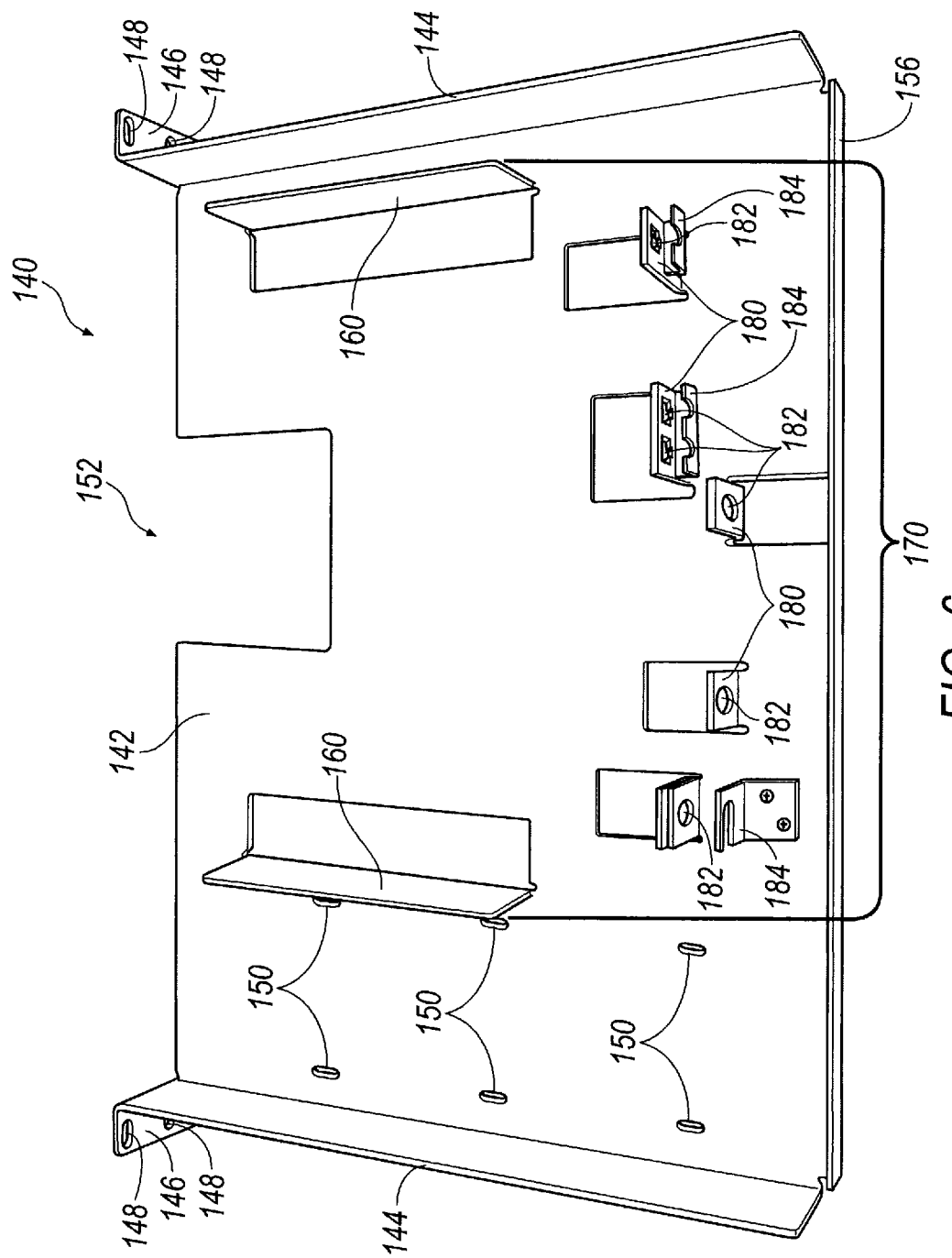
FIG. 6 illustrates an exemplary modem shelf.
Figure 7:
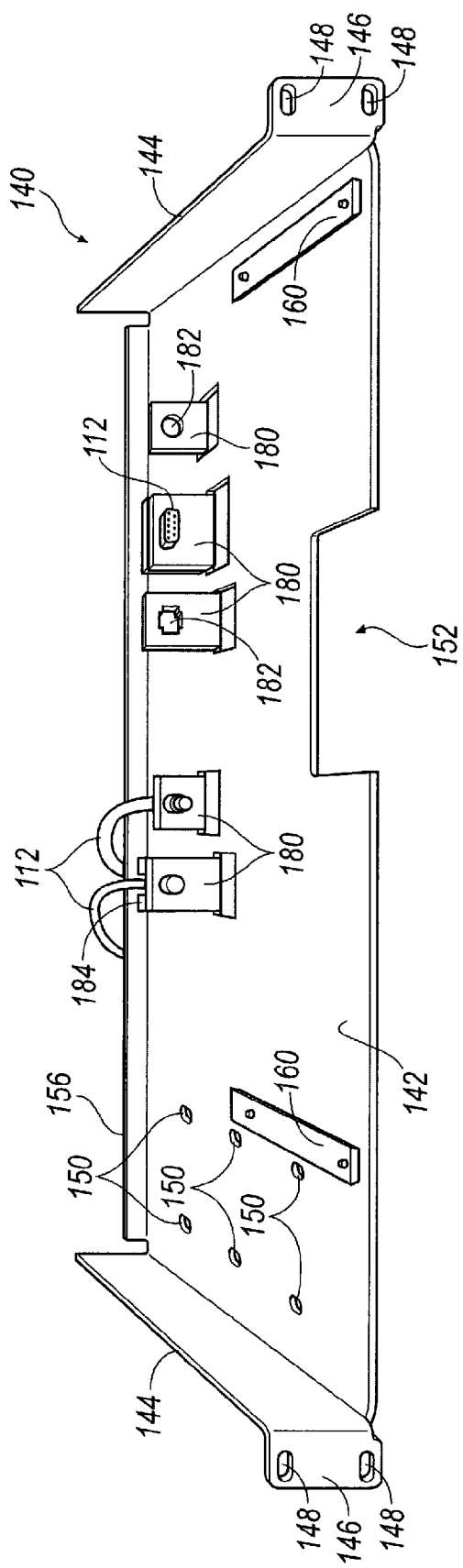
FIG. 7 illustrates an additional exemplary modem shelf.
Figure 8:
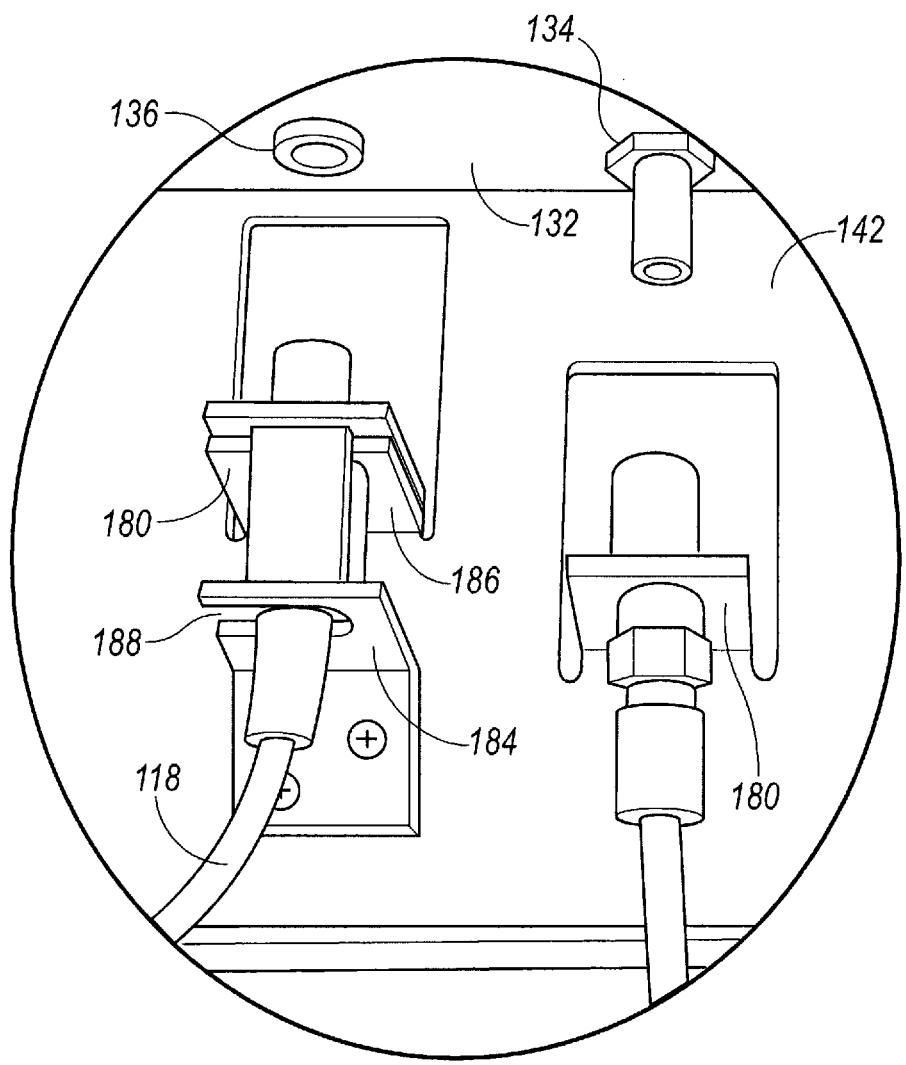
FIG. 8 illustrates a close up view of exemplary supports and positive stops.
Figure 9:
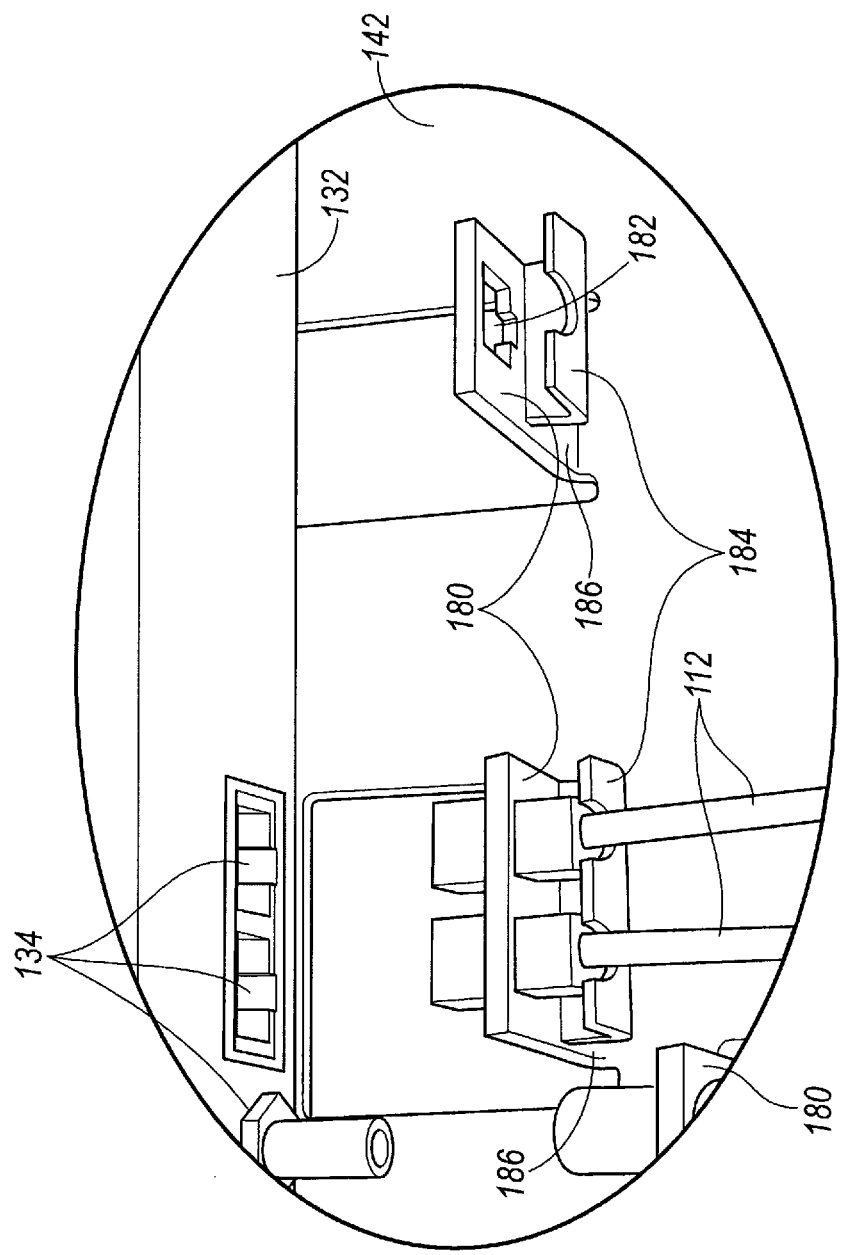
FIG. 9 illustrates an additional close up view of exemplary supports and positive stops.

The media rack 120 provides a platform to house the media lines 112 and a power supply 116 (shown at least in FIG. 2) having a power cable 118. The cables 112, 118 may be connected to the modem 130 upon insertion of the modem 130 into the media rack 120 on a media support shelf 140 (see FIG. 2). To standardize the insertion of the modem 130, the media support shelf 140 may include an alignment mechanism 170. The alignment mechanism 170 (see FIG. 6) may include at least one modem guide 160, at least one generally L-shaped support tab 180 and at least one positive stop 184 positioned adjacent the support tab 180 (discussed in greater detail below). The modem guides 160 are raised above the plane of the top surface 142 and provide repeatable alignment with the cables 112, 118 and communication ports 134 on the back 132 of the modem 130 (see FIGS. 3, 4 & 5). Upon aligning the connection, a technician 126 may log into the auto-configuration server 110, which stores the configuration information from the database server 108 and the hub 104 to upload the configuration. However, prior to uploading the configuration, the technician 126 may perform a verification of the programming parameters, and then the technician 126 may program at least one modem 130 prior to sending the modem 130 into the field for use. After programming, communication to the ports 134 may be verified to ensure proper working condition and the success of the programming.

FIG. 2 illustrates further detail of an exemplary media rack 120. Specifically, the exemplary media rack 120 illustrates a stacked and side by side configuration of the modems 130 as positioned on the media support shelves 140. The modem 130 may be slidingly engaged and connected to the media lines 112 and the power cable 118 by positioning the modem 130 on the support shelf 140 at the front 122 of the rack 120 and by pushing the modem 130 towards the cables 112, 116 at the rear 124 of the rack 120. The media rack 120 provides a stable base for the support shelves 140 and the cables 112, 118. The media rack 120 may provide a cable run (not shown) at the rear 124 of the media rack 120. The cable run may contain at least the cables 112, 118 in an orderly fashion to promote consistency when attaching and programming the modems 130. This may eliminate confusion when attaching cables 112, 118 to the support shelf 140 prior to insertion and programming of the specific modem 130. The media rack 120 also provides a permanent platform that provides consistency for housing the media lines 112 and the power supply 116.

Turning to FIGS. 3-9, an exemplary support shelf 140 and modem 130 are illustrated in further detail. The modem 130 is positioned adjacent the media lines 112, power supply 116 and power cable 118. The power supply 116 may be affixed to a generally planar top surface 142 of the support shelf 140. As illustrated, the exemplary modem 130, with modem back 132, includes the variety of communication ports 134 and a power input port 136 that may engage the media lines 112 and power cable 118. The ports 134, 136 are configured to receive the corresponding cables 112, 118 that may be attached to the at least one generally L-shaped support tab 180 having a base secured to or integral with stop surface 142 as discussed in more detail below and a generally perpendicular leg 186 extending away from the base. Various securement mechanisms such as adhesive, welding, mechanical fasteners and the like may be used to secure the support tab 180 to support shelf 140. Other approaches to securing the various cables 112, 118 may also be appropriate under certain circumstances. The configuration of the support tabs 180 may be dependent upon the specific modem 130 chosen for programming.

The support shelf 140 as illustrated, shows the media lines 112 and the power cable 118 at least semi-permanently affixed to the media shelf 140 through the support tabs 180. The support shelf 140 may include a plurality of the support tabs 180. The support tabs 180 provide support for the media lines 112 and the power cable 118. Each of the support tabs 180 may include at least one of a cable 112, 118 support opening 182 in the form of an aperture or slot and a positive stop 184. The cable support opening 182 may be sized to the exact cable 112 profile that corresponds to the modem's communication ports 134. The sizing of the cable support opening 182 causes a locking mechanism that is generally present on the end of the media lines 112 to be compressed and unable to engage. The compressing of the locking mechanism provides the ability to selectively slide the modem 130 in and out as needed. The positive stop 184 provides a physical hard stop that creates lateral back pressure against the cables' 112, 118 ends. The positive stop 184 may be a separate piece that is attached directly to the planar top surface 142 or to the support tabs 180. Stops 184 may be similar in shape to support tabs 180 and secured in the same manner. The positive stop 184 opening 188 may be an aperture, a slot or any other known shape that is configured to correspond and receive the cables 112, 118. The slot 188, as well as the cable support opening 182 may be configured in a variety of shapes and sizes depending on the type of cable 112, 118 used. Placement of the positive stop 184 is dependent upon the configuration of the support tabs 180 and the type of media line 112 and power cable 118 used. The positive stop 184 keeps the cables 112, 118 in place when sliding the modem 130 in to engage the cables 112, 118. However, support tabs 180 retain the cables 112, 118 when removing the modem 130 from the rack 120. Additionally, the support tabs 180 may be positioned in a variety of locations, depending on the corresponding modem 130 that may be connected. The exemplary support shelf 140, as illustrated, demonstrates one of many possible configurations with interchangeable positioning of the cables 112, 118. Specifically, not all support tabs 180 on the support shelf 140 may be used for one specific modem. This adds to the versatility of an exemplary support shelf 140. Additionally, it should be known that the support tabs 180 opening 182 and the positive stops 184 openings 188 may be sized to create a friction fit. The friction fit may foster resistance between the cable 112, 118 and the openings 182, 188 to provide an appropriate stiffness to the cables 112, 118 during insertion of the modem 130 onto the support shelf 140.

Generally, the support shelf 140 is illustrated as being constructed from a single flat sheet of rigid material that is notched and formed to create a specific feature. The rigid material can be of any suitable type, such as, but not limited to, aluminum, steel, composite or other known material. The support shelf 140 may include the generally planar top surface 142, vertical sides 144, a shelf mounting flange 146 with mounting openings 148, a plurality of power supply mounting apertures 150, a cut-out 152, a stiffening lip 156, the modem guide 160, the support tabs 180 and the cable positive stop 184. It should be known that the support shelf 140 may be constructed utilizing a variety of metal forming techniques, such as, but not limited to, a computer-numerical controlled (CNC) machine tool, a mill, a press or a break.

As previously discussed, the support shelf 140 may be attached to the media rack 120. This is accomplished by inserting any known mechanical fastener or similar mechanism through the mounting openings 148 and into the front face 122 of the media rack 120, which selectively secures the mounting tab 146 to the media rack 120. As discussed above, the modem guides 160 provide alignment to the modem 130 with the support tabs 180 and ultimately the cables 112, 118 that are inserted into the support tabs 180. The modem guides 160 may extend above the surface of the planar top surface 142 at a predetermined distance that is tall enough to prevent lateral movement of the modem 130 when sliding the modem 130 into position. The alignment feature allows the technician to insert and remove a large number of modems 130 without connecting and disconnecting multiple cables 112, 118 each time. This provides process repeatability and eliminates the possibility of misconnecting the cables 112, 118 with the incorrect communication port 134 on the modem back 132.

The power supply apertures 150 are provided to retain the power supply 116 to the planar top surface 142 of the support shelf 140. The power supply apertures 150 extend through the planar top surface 142 and provide at least one mounting point for securing the power supply 116 to the support shelf 140. The power supply 116 may be secured to the top surface with straps or other known fastening mechanisms and is connected to a conventional power source on the media rack 120.

The vertical sides 144 and the stiffening lip 156 provide rigidity to the support shelf 142 and help to protect the support shelf 142 from unwanted bending. The vertical sides 144 may be created using a separate plate that is attached at the outer side edge of the planar top surface 142, while the stiffening lip is attached to the outer rear edge. The vertical sides 144 and the stiffening lip 156 may also be formed by bending a pre-determined amount of the planar top surface 142 to create an approximate 90° angle bend, such that the vertical sides 144 and stiffening lip 156 are generally perpendicular to the top surface 142. Similarly, the shelf mounting flange 146 may be constructed of a separate piece of plate and then attached to a leading edge of the vertical sides 144. Additionally, the flange 146 may be created by bending a predetermined portion to an approximate 90° angle bend, such that the flange 146 extends outwardly from the planar surface 142 and is perpendicular to the leading edge of the vertical side 144. The predetermined portion of the support tabs 180 and the mounting flange 146 is determined by the mounting space available in and on the media rack 120. The predetermined portion of the stiffening lip 156 may be based on the height of the ports 134 on the back of the modem 130, such that the stiffening lip 156 does not interfere with connecting the cables 112, 118 to the support tabs 180.

Fabrication of the modem guide 160 and the support tabs 180 may be conducted similar to the fabrication of the vertical sides 144 and the mounting flanges 146. However, since the modem guide 160 and the support tabs 180 are more centrally located within the outer edges of the planar surface 142, multiple preliminary through cuts may be undertaken prior to forming the vertical portions of the modem guides 160 and the support tabs 180. Specifically, one side of the modem guide 160 and one side or leg of the support tab 180 must remain as an integral part of the planar surface 142; thus at least three sides of the modem guide 160 and at least three sides of the support tab 180 may be through cut to leave the one side of each attached to the planar surface 142. By leaving one side physically attached to the planar surface 142, a hinge is created allowing the guide 160 and the support tab 180 to bend at the attached portion. After the three cuts are made, penetrating the planar surface 142, the guide 160 and the support tabs 180 are forced upwardly in a vertical direction until an approximate 90° angle bend is achieved at the hinge. Additionally, the modem guide 160 and the support tabs 180, like the vertical sides 144 and the mounting flange 146, may be made of separate pieces that may be attached, in any desired configuration, to the planar surface 142. It should be known that all of the apertures 148, 150, 182 and the cut-out 152 may be through cut and created at any time during the fabrication process.

Attachment of the separate components may be by any known method of mechanical attachment, such as, but not limited to, welding, fastening, bonding, machining, press fit or any other known mechanical attachment method. Merely by way of example, manufacturing an aluminum support shelf 140 may include the use of a cutting machine to remove material and to cut the rigid materials, as needed. Typical cutting machines may be, but are not limited to a press, a mill, a laser cutter, a plasma cutter, a water jet or other known precision cutting machines. Generally, the cutting machine may be programmed to the specific modem layout, then the machine selectively cuts at least one of the through apertures 150, the cut-out 152, the modem guide 160, the cable support openings 182 and the support tabs 180 to create at least one of the shapes of a given feature.

Figure 10:
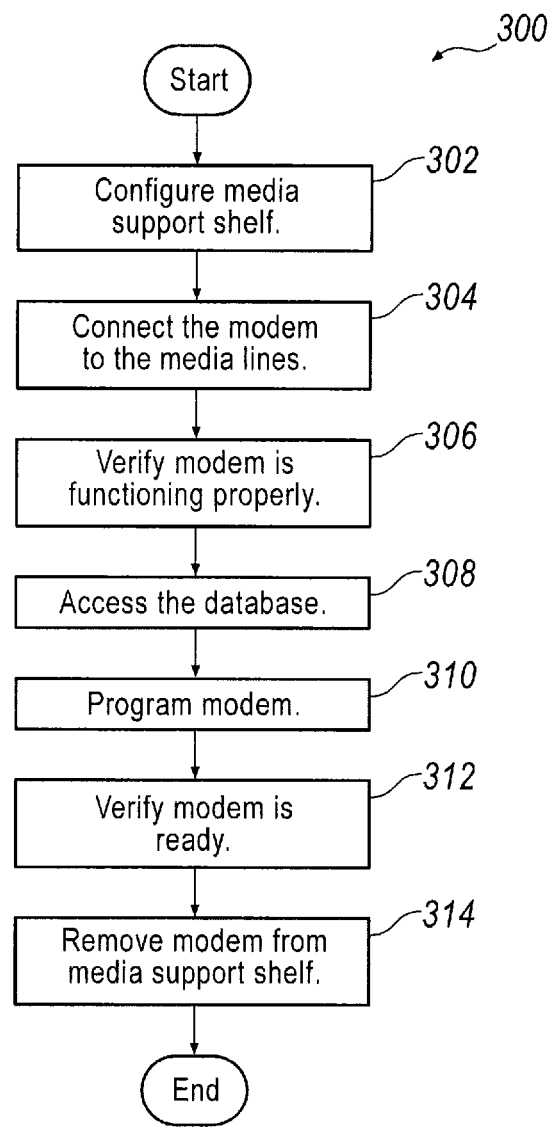
FIG. 10 illustrates an exemplary process for configuring an exemplary modem.

Proceeding now to FIG. 10, an exemplary process for configuring a modem 130 associated with a communication network 100 is illustrated. Process 300 may begin at block 302, where a technician configures a pre-formed media support shelf 140 that is attached to a media rack 120 by inserting specific media lines 112 into support tabs 180 that extend from the support shelf 140 in a pre-formed configuration for a specific modem. Additionally, a power supply cable 118 is inserted into a support tab 180 on the support shelf 140. Process 300 may then proceed to block 304. In block 304, the modem 130 is connected to the media lines 112 and power supply cable 118 by sliding the modem 130 onto a planar surface 142 of the support shelf 140. Sliding the modem 130 onto the support shelf 140 allows the modem guides 160 that extend vertically from the support shelf 140 to self locate the modem 130. The self location provides a straight-line path for ports 134, located on the modem back 132, to engage the media lines 112 and the power supply cable 118.

In block 306, the modem 130 may be powered on and the communication ports 134 may be tested to verify that the modem 130 configuration is correct. This verification of the configuration is done by ensuring the modem 130 is powered on and that proper communication is occurring between the modem 130, an Ethernet switch 114 and an auto-configuration server 110. Turning to block 308, a technician may access the database 108 to retrieve a configuration program that is specific to the VSAT network. The configuration program will allow users connected to the network the ability to communicate across the VSAT satellite system by transmitting and receiving data. Once the program is retrieved from the database, we turn to block 310 to program a bank of modems 130 that are connected through the Ethernet switch 114. The loading of the program is conducted by the auto-configuration server 110, which allows a single technician to program numerous modems 130 at one time.

After the programming is complete, in block 312, the technician will verify that the program was successful, utilizing a diagnostic feature in the auto-configuration server 110. This allows the technician the ability to ensure that a correctly programmed modem 130 is in good working order prior to employment in the field. Once the verification is complete, in block 314, the technician may remove the modem 130 from the support shelf 140 by grasping the modem 130 through a cut-out 152 in the support shelf 140 and sliding the modem 130 off the support shelf 140 and out of the media rack 120. Sliding the modem 130 out, the technician disengages the modem 130 from the media lines 112 and the power cable 118. Merely by way of example, the whole process, from start to finish, allows a single technician to program approximately 50 modems 130 in one hour. However, this number may increase or decrease depending on the technician's needs and on the number of media lines 112 that can extend from an Ethernet switch 114.

An exemplary method may include organizing a media rack and a modem support shelf with a desired wiring configuration based on a desired modem, inserting a multitude of the desired modem into multiple modem racks by sliding the modems along alignment rails to engage the wiring configuration with the modems' communication ports, setting up an auto-configuration server by downloading a system program from the communication hub's configuration, verifying the modems' communication ports are working properly and then uploading that configuration to multiple modems at least generally simultaneously. The method may further include verifying that the programming was uploaded successfully.

In general, computing systems and/or devices, such as database server 108 and auto-configuration server 110 may employ any of a number of well known computer operating systems, including, but by no means limited to, known versions and/or varieties of the Microsoft Windows® operating system, the Unix operating system (e.g., the Solaris® operating system distributed by Sun Microsystems of Menlo Park, Calif.), the AIX UNIX operating system distributed by International Business Machines of Armonk, N.Y., and the Linux operating system. Examples of computing devices include, without limitation, a computer workstation, a server, a desktop, notebook, laptop, or handheld computer, or some other known computing system and/or device.

Computing devices generally include computer-executable instructions, where the instructions may be executable by one or more computing devices such as those listed above. Computer-executable instructions may be compiled or interpreted from computer programs created using a variety of well known programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners, as is known. A file system may be accessible from a computer operating system, and may include files stored in various formats. An RDBMS generally employs the known Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

Reference in the specification to "one example," "an example," "one embodiment," or "an embodiment" means that a particular feature, structure, or characteristic described in connection with the example is included in at least one example. The phrase "in one example" in various places in the specification does not necessarily refer to the same example each time it appears.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary in made herein. In particular, use of the singular articles such as "a," "the," "the," etc. should be read to recite one or more of the indicated elements unless a claim recites an explicit limitation to the contrary.

What is claimed is:

1. A system comprising:
   a plurality of modems configured to receive a configuration signal;
   an auto-configuration server for generally simultaneously configuring the plurality of modems;
   a media line operable to convey the configuration signal from the auto-configuration server;
   a media rack; and
   at least one media support surface selectively movable within the media rack and configured to selectively receive at least one modem,
   wherein the media support surface includes a support tab that is configured to selectively engage the media line such that, when engaged by the support tab, the media line is fixedly held by the support tab such that, as the at least one modem is received by the media support surface, the media line engages an input port of the at least one modem,
   wherein the modem is at least one of an iDirect™ modem and a LinkStar™ modem.

2. The system of claim 1, further including an alignment mechanism to facilitate the selective positioning of the at least one modem with the media support surface.

3. The system of claim 2, wherein the alignment mechanism includes the support tab, the support tab having at least one opening configured to receive and facilitate securement of an end of the media line.

4. The system of claim 3, wherein the alignment mechanism further including a plurality of alignment guides, the alignment guides containing the at least one modem as the at least one modem is received on the media support surface.

5. The system of claim 4, wherein at least one of the support tab and an alignment guide is formed from a portion of the media support surface.

6. The system of claim 3, further comprising a positive stop adjacent the support tab that facilitates securement of the end of the media line.

7. The system of claim 6, wherein the positive stop is affixed directly to at least one of the media support surface and the support tab.

8. The system of claim 6, wherein at least one of the support tab and the positive stop is configured to foster resistance with the media line.

9. The system of claim 1, further comprising:
   an alignment mechanism configured to facilitate the selective positioning of the at least one modem with the media support surface wherein the alignment mechanism includes the support tab, the support tab having at least one opening configured to receive and facilitate securement of an end of the media line, and wherein the alignment mechanism further includes a plurality of alignment guides, the alignment guides containing the at least one modem as the modem is received on the media support surface; and
   a positive stop adjacent the support tab that facilitates securement of the end of the media line, wherein the positive stop is affixed directly to at least one of the media support surface and the support tab, and wherein at least one of the support tab and the positive stop is configured to foster resistance with the media line sufficient to fixedly hold the media line as the media line engages the input port of the at least one modem.

10. A system, comprising:
    a media rack;
    a plurality of media components;
    a plurality of media lines;
    a plurality of component shelves selectively received within the media rack, each being configured to slidably receive a corresponding one of the plurality of media components and each including:
       an alignment guide that is configured to, as the corresponding media component is slidably received by the component shelf, automatically direct the corresponding media component to a correct position, and
       a support tab that is configured to selectively engage one of the plurality of the media lines such that, when engaged by the support tab, the media line is fixedly held by the support tab such that a communication port of the corresponding media component automatically engages the held media line when the corresponding media component is slidably received into the correct position; and
    a media component programming device,
    wherein each media line is operable to convey a configuration signal from the component programming device for generally simultaneous configuration of the plurality of media components,
    wherein the plurality of media components are each at least one of an iDirect™ modem and a LinkStar™ modem.

11. The system of claim 10, wherein the support tab is formed from a portion of the component shelf.

12. The system of claim 10, wherein the plurality of component shelves each includes a component shelf top surface, and the alignment guide extends away from the component shelf top surface.

13. The system of claim 10,
    wherein each of the plurality of component shelves further includes a positive stop fixed with respect to a top surface of the component shelf, each positive stop being adjacent to a corresponding support tab and being configured to provide a friction fit for the media line held by the corresponding support tab, the friction fit fixedly securing the media line in place as the corresponding media component is slidably received into the correct position.

14. The system of claim 10, wherein each of the plurality of component shelves is constructed from at least one of an aluminum sheet, a steel sheet, a carbon-fiber and a composite.

15. The system of claim 10, wherein each of the plurality of component shelves further comprises:
- a support opening through the support tab for receiving at least one media line; and
- a positive stop adjacent to the support tab and fixed with respect to the component shelf, the positive stop includes a stop opening for receiving the media line held by the support tab, wherein the support tab and the positive stop are configured to fixedly secure the media line in place as the corresponding media component is slidably received into the correct position.

16. A method, comprising:
providing an auto-configuration server;
providing a plurality of modems that are each at least one of an iDirect™ modem and a LinkStar™ modem;
providing a plurality of media lines;
providing a plurality of power lines;
providing a support rack containing a plurality of media support shelves, each slidably receiving a corresponding one of the plurality of modems and each including:
- an alignment guide that, as the corresponding modem is slidably received by the media support shelf, automatically directs the corresponding modem to a correct position,
- a first support tab that selectively engages one of the plurality of the media lines such that, when engaged by the support tab, the media line is fixedly held by the support tab such that a communication port of the corresponding modem automatically engages the held media line when the corresponding modem is slidably received into the correct position, and
- a second support tab that selectively engages one of the plurality of the power lines such that, when engaged by the support tab, the power line is fixedly held by the support tab such that a power-line-connection-port of the corresponding modem automatically engages the held power line when the corresponding modem is slidably received into the correct position;

for each of the plurality of modems, inserting a first end of one of the media lines into the first support tab of the corresponding media support shelf and inserting a first end of one of the power lines into the second support tab of the corresponding media support shelf;

for each of the plurality of modems, connecting a second end of the media line to the auto-configuration server so that the media line is able to convey a configuration signal from the auto-configuration server and connecting a second end of the power line to a power supply;

for each of the plurality of modems, sliding the modem into the corresponding support shelf such that the alignment guide automatically directs the corresponding modem to the correct position and the communication port of the modem engages the media line and the power-line-connection-port of the modem engages the power line;

activating the auto-configuration server to program the plurality of modems generally simultaneously; and verifying a successful modem configuration.

17. The method of claim 16, wherein, for each of the plurality of media support shelves, the alignment guide is fixed with respect to the media support shelf and the alignment guide contains the modem when the modem is sliding into engagement with the media line.

18. The method of claim 16, wherein, for each of the plurality of media support shelves, a positive stop is attached to at least one of the first support tab, the second support tab and the support shelf, the positive stop selectively locking the media line to the first support tab or selectively locking the power line to the second support tab.

19. The method of claim 16, wherein, for each of the plurality of media support shelves, the alignment guide is formed from a portion of a top surface of the support shelf.

20. The method of claim 16, wherein, for each of the plurality of media support shelves, the first and second support tabs are formed from a portion of a top surface of the support shelf.

21. The method of claim 16, further comprising accessing a database, retrieving a satellite modem configuration and storing the configuration on the auto-configuration server.

22. The method of claim 21, further comprising verifying each of the plurality of modems is functioning properly prior to uploading the configuration to each modem.

* * * * *